(12) United States Patent
Ding (10) Patent No.: US 7,502,249 B1
(45) Date of Patent: Mar. 10, 2009

(54) METHOD AND SYSTEM FOR USING A PULSED FIELD TO ASSIST SPIN TRANSFER INDUCED SWITCHING OF MAGNETIC MEMORY ELEMENTS

(75) Inventor: Yunfei Ding, Milpitas, CA (US)

(73) Assignees: Grandis, Inc., Milpitas, CA (US); Renesas Technology Corp., Tokyo (JP)

( * ) Notice: Subject to any disclaimer, the term of this patent is extended or adjusted under 35 U.S.C. 154(b) by 134 days.

(21) Appl. No.: 11/736,290

(22) Filed: Apr. 17, 2007

Related U.S. Application Data (63) Continuation-in-part of application No. 11/487,723, filed on Jul. 17, 2006.

(51) Int. Cl.
*G11C 11/00* (2006.01)

(52) U.S. Cl. .................. 365/158; 977/934; 977/935; 365/173

(58) Field of Classification Search ............... 365/148, 365/158, 171, 173; 257/421; 438/3; 977/934, 977/935
See application file for complete search history.

(56) References Cited

U.S. PATENT DOCUMENTS

| | | | |
|---|---|---|---|
| 5,480,694 A * | 1/1996 | Daimon et al. ............. 428/64.1 |
| 6,211,090 B1 | 4/2001 | Durlam et al. | |
| 6,545,906 B1 * | 4/2003 | Savtchenko et al. .......... 365/158 |
| 6,603,677 B2 * | 8/2003 | Redon et al. ................ 365/158 |
| 6,611,405 B1 | 8/2003 | Inomata et al. | |
| 6,714,444 B2 * | 3/2004 | Huai et al. .................. 365/171 |
| 7,006,375 B2 | 2/2006 | Covington | |
| 2002/0036919 A1 * | 3/2002 | Daughton et al. ........... 365/173 |
| 2002/0105827 A1 * | 8/2002 | Redon et al. ................ 365/173 |
| 2002/0140060 A1 * | 10/2002 | Asao et al. .................. 257/661 |
| 2002/0149962 A1 * | 10/2002 | Horiguchi .................... 365/173 |
| 2004/0233760 A1 | 11/2004 | Guo et al. | |
| 2004/0246775 A1 * | 12/2004 | Covington .................. 365/173 |
| 2005/0106810 A1 * | 5/2005 | Pakala et al. ................ 438/257 |

OTHER PUBLICATIONS

IBM Journal of Research & Development vol. 50 No. 1 (Jan. 31, 2006), pp. 69-79, Single-Domain Model for Toggle MRAM, by D. C. Worledge.*

(Continued)

*Primary Examiner*—Richard Elms
*Assistant Examiner*—Harry W Byrne
(74) *Attorney, Agent, or Firm*—Strategic Patent Group, P.C.

(57) ABSTRACT

A method and system for providing and utilizing a magnetic memory are described. The magnetic memory includes a plurality of magnetic storage cells. Each magnetic storage cell includes magnetic element(s) programmable due to spin transfer when a write current is passed through the magnetic element(s) and selection device(s). The method and system include driving a first current in proximity to but not through the magnetic element(s) of a portion of the magnetic storage cells. The first current generates a magnetic field. The method and system also include driving a second current through the magnetic element(s) of the portion of the magnetic storage cells. The first and second currents are preferably both driven through bit line(s) coupled with the magnetic element(s). The first and second currents are turned on at a start time. The second current and the magnetic field are sufficient to program the magnetic element(s).

20 Claims, 7 Drawing Sheets

OTHER PUBLICATIONS

IBM Journal of Research & Development vol. 50 No. 1 (Jan. 31, 2006), pp. 81-100, Spin Angular Momentum Transfer in Current-Perpendicular Nanomagnetic Junctions, by J. Z. Sun.*

IBM Journal of Research & Development vol. 50 No. 1 (Jan. 31, 2006), pp. 101-110, Spintronics-A Retrospective and Perspective, by S.A.. Wolf, et al.*

IBM Journal of Research & Development vol. 50 No. 1 (Jan. 31, 2006), pp. 25-39, Design Considerations for MRAM, by T.M. Maffitt et al.*

J.C. Slonczewski, Current-driven excitation of magnetic multilayers, Journal of Magnetism and Magnetic Materials, 159 (1996) L1-L7.

J.Z. Sun, et al., Spin angular momentum transfer in a current-perpendicular spin-valve nanomagnet, Proc. SPIE vol. 5359, 445 (2004).

* cited by examiner

METHOD AND SYSTEM FOR USING A PULSED FIELD TO ASSIST SPIN TRANSFER INDUCED SWITCHING OF MAGNETIC MEMORY ELEMENTS

CROSS-REFERENCE TO RELATED APPLICATIONS

This application is a continuation-in-part of Co-pending U.S. patent application entitled Method and System for Using a Pulsed Field to Assist Spin Transfer Induced Switching of Magnetic Memory Elements, Ser. No. 11/487,723, filed Jul. 17, 2006, assigned to the assignee of the present application, and incorporated herein by reference.

FIELD OF THE INVENTION

The present invention relates to magnetic memory systems, and more particularly to a method and system for switching magnetic storage cells using a spin transfer effect at a lower current density.

BACKGROUND OF THE INVENTION

Figure 1:
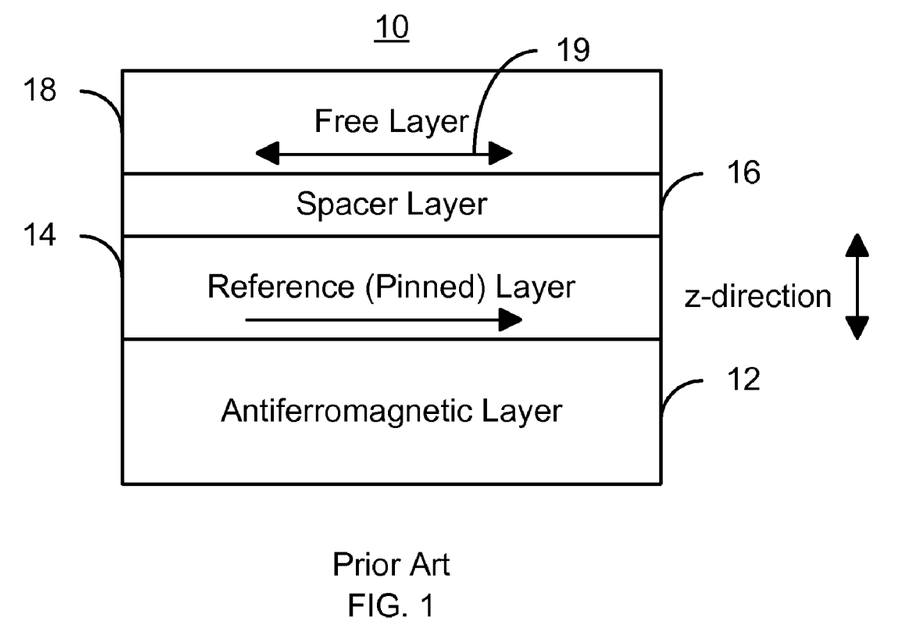
FIG. 1 is a diagram of a conventional magnetic element.

FIG. 1 depicts a typical conventional magnetic element 10. The conventional magnetic element 10 can be used in nonvolatile memories, such as a magnetic random access memory (MRAM). The magnetic element 10 typically includes a reference layer 14, a spacer layer 16, and a free layer 18. The free layer 18 has a magnetization having an equilibrium position along an easy axis 19. The easy axis can be inside the film plane or out of the film plane. Other layers, such as antiferromagnetic pinning layers 12 might also be provided. Moreover, other similar structures, such as dual magnetic tunneling junctions (MTJs) and MTJ-Spin Valve dual structures with spacer and/or barrier layers at both sides of the free layer, might be used. For clarity only single reference layer 14, spacer layer 16 and free layer 18 are plotted. The reference layer 14 and free layer 18 are typically ferromagnetic, but may be multilayers including both ferromagnetic and non-ferromagnetic layers. The spacer layer 16 is nonmagnetic and may be insulating (for example in a magnetic tunneling junction) or conductive (for example in a spin valve). The difference in orientations of the magnetizations of the free layer 18 and the reference layer 14 determines the resistance of the conventional magnetic element 10 and thus the state of the conventional magnetic element 10. When the free layer and the reference layer are substantially parallel the magnetic element 10 has a resistance R, when the free layer and the reference layer magnetization are substantially anti-parallel the magnetic element 10 has a resistance R+ΔR. The resistance difference, ΔR, can be positive or negative depending on the materials chosen for the different layers of the magnetic element 10. The state of the magnetic element can be determined by measuring its resistance.

Figure 2:
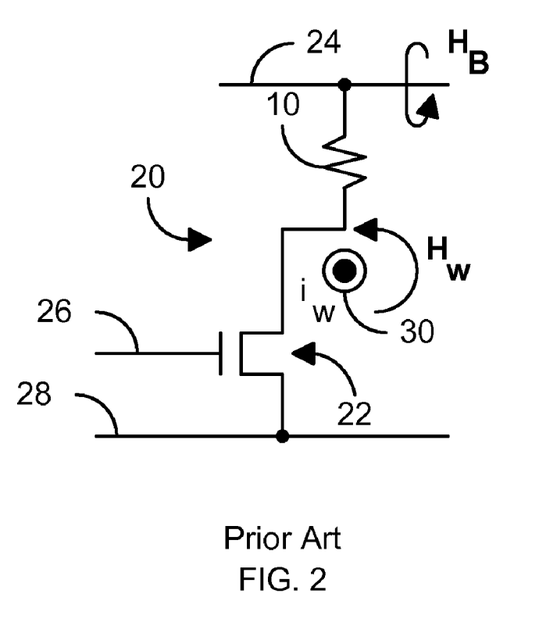
FIG. 2 is a diagram of a conventional magnetic element used in a field-switched magnetic memory.

The conventional magnetic element 10 may be programmed either using a magnetic field or a current driven through the magnetic element (e.g. using the spin transfer effect). FIG. 2 depicts the conventional magnetic storage cell 20 that is used in a memory and programmed using a conventional magnetic field switching method. Referring to FIGS. 1 and 2, the magnetic element 10 is part of a conventional magnetic storage cell 20 that also includes a selection transistor 22. Also depicted are a corresponding bit line 24 connected to the conventional magnetic element 10, a read word line 26 connected to the selection transistor 22, a source line 28 connected to the selection transistor 22 and a write word line 30. In field switching, the bit line 24 and the word line 30 are activated, currents $i_b$ and $i_w$ are driven through the bit line 24 and the write word line 30, respectively. Typically, the bit line 24 and the write word line 30 are mutually perpendicular, as shown in FIG. 2. During such a write operation, the selection transistor 22 is disabled to preclude current from being driven through the conventional magnetic element 10. The currents $i_b$ and $i_w$ produce two magnetic fields, $H_B$ and $H_W$, respectively. The conventional magnetic element 10 of the storage cell 20 in the region where the bit line 24 and write word line 30 cross (the "crosspoint") experiences both magnetic fields. Consequently, the magnetization of the free layer 18 of the conventional magnetic element 10 may switch directions. The conventional magnetic element 10 is, therefore, programmed. Other conventional magnetic elements (not shown) for other magnetic storage cells (not shown) in a memory array only experience the field from at most one of the active bit line 24 and the active write word line 30. Consequently, other magnetic storage cells should not be switched.

Although the conventional magnetic element 10 can be programmed as depicted in FIG. 2, programming utilizing field switching has significant drawbacks. These drawbacks may be particularly severe for higher memory densities. For example, the field switching mechanism in a high density memory array suffers from a half selection problem. In particular, a conventional magnetic element 10 that only experiences the magnetic field $H_B$ or $H_W$ from either the bit line 24 or the write word line 30, but not both, may be accidentally switched. Undesired writing may thus occur. Furthermore field writing may not be easily scaled to higher densities due to the complicated cell structure. When the conventional magnetic element 10 is reduced in size, larger magnetic fields may be required to write to the conventional magnetic element 10. Consequently, larger currents $i_b$ and $i_w$ may be needed to program the conventional magnetic element 10. The operation current is typically greater than ten milliamps, which is significantly larger than desired.

In another method, the magnetization state of the magnetic elements 10 may also be switched using the spin transfer effect. Spin transfer based switching is desirable because spin transfer is a localized phenomenon that may be used to write to a cell without inadvertently writing to neighboring cells. Consequently, it would be desirable to use the conventional magnetic elements 10 in a magnetic memory, such as MRAM, that employs spin transfer switching.

Figure 3:
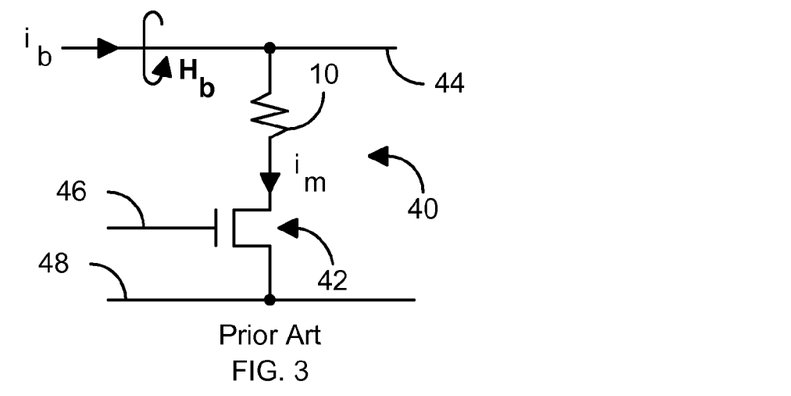
FIG. 3 is a diagram of a conventional magnetic element used in a conventional current-switched magnetic memory.

FIG. 3 depicts a conventional magnetic storage cell 40 including the conventional magnetic element 10 and residing in a memory that uses spin transfer based programming. The conventional storage cell 40 includes a conventional magnetic element 10 that is typically an MTJ and a selection transistor 42. Also depicted are a conventional bit line 44, a conventional word line 46, and a conventional source line 48. Referring to FIGS. 1 and 3, this switching mechanism for the conventional magnetic storage cell 40 uses a current $i_m$ passing perpendicular to the planes (in the z-direction in FIG. 1) of the layers of the conventional magnetic element 10. When the selection transistor 42 is activated by the conventional word line 46 and a current is passed through the magnetic element 10, the electrons carrying the current become spin-polarized by the local magnetization. The polarized electrons exert a torque on the magnetization of the free layer 18. This spin transfer torque may generate spin waves and/or complete switching of the magnetization of the free layer 18 when the current $i_m$ reaches a critical value $i_c$. When the current is driven from the free layer 18 to the reference layer 14, the spin transfer torque can switch the free layer magnetization to be parallel to the conventional reference layer 14 magnetization. When the current is driven in the opposite direction, the spin transfer torque is also in the opposite direction and can switch the magnetization of the free layer 18 to be anti-parallel to that of the conventional reference layer 14. Thus the magnetic element 10 can be programmed. During reading a read current is passed through the magnetic element 10 to sense the resistance of the magnetic element 10 that depends on the relative orientation of the magnetizations of the free layer 10 and of the reference layer 14. Note that the read current should be less than the current used in writing in order to avoid inadvertently writing to the magnetic element 10.

Programming the magnetic storage cell 40 using the spin transfer effect has benefits. In particular, the spin transfer effect is a more localized phenomenon. Thus, the conventional magnetic storage cell 40 may not suffer from the half selection problem. In addition, such technology is characterized by good scalability. Stated differently, a magnetic memory using the magnetic storage cell 40 is easier to scale to higher densities. Moreover, the switching current required to program the magnetic element is relatively small. For example, in some applications, the write current needed for switching the free layer of the magnetic element 10, or the critical current $i_c$, is less than approximately one milliamp.

Although use of the spin transfer effect has significant benefits, one of ordinary skill in the art will recognize that there are also drawbacks. For the sizes of the magnetic element 10 at which spin transfer switching becomes important, even the low critical current of approximately one milliamp corresponds to a current density of approximately $10^6$~$10^7$ A/cm$^2$. Such a large current density passing through the conventional magnetic element 10, particularly when an insulating spacer layer 16 is used, may adversely affect the reliability of the magnetic storage cell 40. For example, the large current density may damage or break down the insulating spacer layer 16. Moreover, such a large current density requires a large selection transistor 42. The large selection transistor 42 required to provide this large current density may limit the density of a memory array formed using the magnetic storage cell 40.

To address problems in the spin transfer based switching scheme, magnetic field assisted current switching has been proposed. In one such scheme, referring to FIG. 3, the bit line can be arranged so that the current in the bit line 44, $i_b$, which is also driven through the magnetic element 10, generates a magnetic field $H_b$ that assists in switching the magnetic element 10. The use of the magnetic field $H_b$ reduces the critical current. However, the bit line current is relatively small $i_b=i_m$, on the order of one milliamp or less. Consequently, the strength of the field used in assisting switching is small, providing very little assistance in switching the magnetic element 10.

Figure 4:
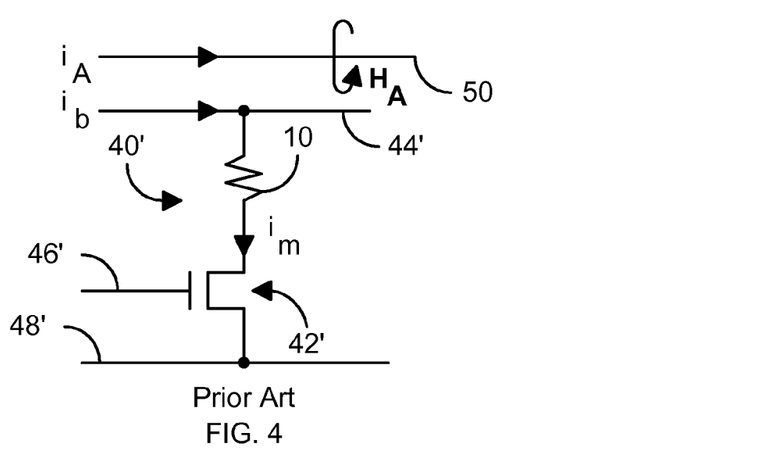
FIG. 4 is a diagram of a conventional magnetic element used in a conventional field-assisted magnetic memory.

FIG. 4 depicts a magnetic storage cell 40' in another such conventional magnetic field assisted current switching scheme. The components depicted in FIG. 4 that are analogous to those depicted in FIG. 3 are labeled similarly. Consequently, storage cell 40', a selection transistor 42', a bit line 44', a word line 46' and a source line 48' are shown. In addition, a conventional field line 50 is depicted. A current, $i_A$, is driven through the conventional field line 50 that generates a field, $H_A$, that assists in switching the state of the conventional magnetic element 10. In similar schemes, the conventional field line 50 may be perpendicular to the conventional bit line 44' and/or below the magnetic element 10. In such scheme a large magnetic field could be generated. However, the extra, conventional field line 50 is used. The fabrication of the conventional field line 50 increases the manufacturing complexity and may adversely affect the density of a memory using such lines 50.

Accordingly, what is needed is a system and method for providing a magnetic memory element that can be switched using a lower current density. The present invention addresses such a need.

BRIEF SUMMARY OF THE INVENTION

The present invention provides a method and system for providing and using a magnetic memory. The magnetic memory includes a plurality of magnetic storage cells. Each of the plurality of magnetic storage cells includes at least one magnetic element and at least one selection device. The at least one magnetic element is programmable due to spin transfer when a write current is passed through the at least one magnetic element. The method and system include driving a first current in proximity to but not through the at least one magnetic element of a portion the plurality of magnetic storage cells. The first current generates a first magnetic field. The method and system also include driving a second current through the at least one magnetic element of the portion of the plurality of magnetic storage cells. The first and second current are preferably both driven through bit line(s) coupled with the at least one magnetic element. The second current and the first current are turned on at a start time. The spin transfer torque induced by the second current and the magnetic field induced by the first current are sufficient to program the at least one magnetic element.

According to the method and system disclosed herein, the present invention provides an improved mechanism for programming magnetic memories.

DETAILED DESCRIPTION OF THE INVENTION

The present invention relates to a magnetic memory. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing and using a magnetic memory. The magnetic memory includes a plurality of magnetic storage cells. Each of the plurality of magnetic storage cells includes at least one magnetic element and at least one selection device. The at least one magnetic element is programmable due to spin transfer when a write current is passed through the at least one magnetic element. The method and system include driving a first current in proximity to but not through the at least one magnetic element of a portion the plurality of magnetic storage cells. The first current generates a first magnetic field. The method and system also include driving a second current through the at least one magnetic element of the portion of the plurality of magnetic storage cells. The first and second current are preferably both driven through the bit line(s) coupled with the at least one magnetic element. The second current and the first current are turned on at a start time. The second current and the first magnetic field are sufficient to program the at least one magnetic element.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. For example, the method and system are often described in the context of a single magnetic storage cell in a magnetic memory. However, one of ordinary skill in the art will readily recognize that memory arrays typically include a large number of magnetic storage cells. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the methods are described in the context of flow charts having certain steps. However, one of ordinary skill in the art will readily recognize that steps in the method could be performed at effectively the same time. In addition, for simplicity some steps may be omitted. The present invention is also described in the context of single elements. However, one of ordinary skill in the art will readily recognize that the present invention is consistent with the use of magnetic memories having multiple elements, bit lines, word lines, and other components.

Figure 5:
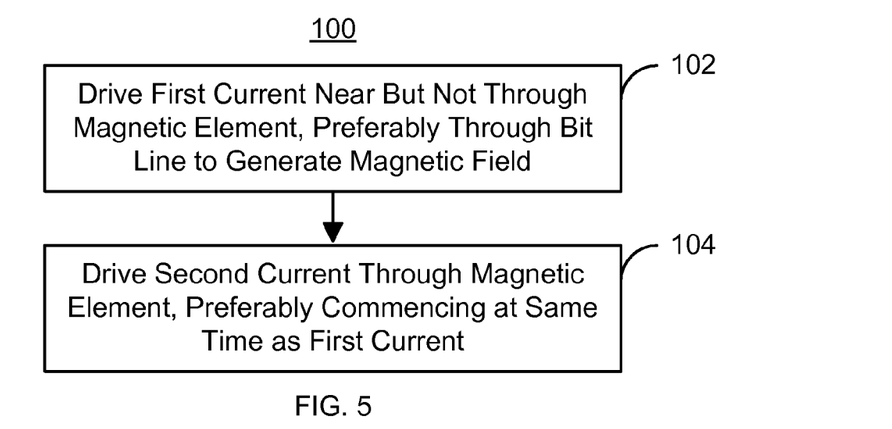
FIG. 5 is a flow chart depicting one embodiment of a method in accordance with the present invention for performing field-assisted switching in a magnetic memory.

To more particularly describe the method and system in accordance with the present invention, refer to FIG. 5 is a flow chart depicting one embodiment of a method 100 in accordance with the present invention for performing field-assisted switching in a magnetic memory. The magnetic memory includes a plurality of magnetic storage cells that are preferably arranged in an array of rows and columns. Each magnetic storage cell includes a magnetic element and a selection device that is preferably a selection transistor. The magnetic element is programmable due to spin transfer when a sufficient write current is passed through the magnetic element. Thus, when a sufficient write current is passed in one direction through the magnetic element, the magnetic element might be programmed to a first state. When a sufficient write current is passed in a second direction preferably opposite to the first direction, the magnetic element might be programmed to a second state. This sufficient write current may be lowered when field assisted switching in accordance with the present invention is utilized. Thus, the magnetic element used may be a magnetic element such as the magnetic element 10. In addition, the magnetic memory preferably includes word lines connected to the gates of the selection transistors, bit lines connected to the magnetic elements, and source lines connected to the sources of the selection transistors. For clarity some steps may be omitted. In addition, some steps may be performed substantially simultaneously.

A first current is driven in proximity to but not through the magnetic element(s) of magnetic storage cell(s) selected for writing, via step 102. In a preferred embodiment, the first current is driven through the bit line. The first current generates a magnetic field that is in an appropriate direction at the magnetic element for assisting in switching the magnetic element. Also in a preferred embodiment, the current is pulsed in step 102. Thus, the magnetic field is also pulsed. A second current is driven through the magnetic element(s) of the selected magnetic storage cells, via step 104. In a preferred embodiment, the second current is also driven through the bit line(s) connected to the magnetic element(s) of the selected magnetic storage cells. The second current and the first current are preferably turned on at a start time. Thus, the first and second currents preferably start at the same time. The combination of the magnetic field generated by the first current and the second current are sufficient to program the magnetic element(s).

Because field assisted spin transfer switching is used in the method 100, the second current required to switch the magnetic element(s) may be reduced. Consequently, reliability of the magnetic storage cell may be improved. For similar reasons, the size of the selection transistor and, therefore, the size of the whole storage cell may be reduced. In addition, because the first current generating the magnetic field is not driven through the magnetic element(s), the first current may be large. As a result, the magnetic field strength, which is proportional to current, might be large, for example greater than ten Oersted. Stated differently, the first current might be much larger than the current passing through the magnetic element. Thus, the magnetic field due to the first current is not limited by the current passing through the MTJ cell. In some embodiments, the first current might be practically independent of the switching current. Consequently, the first current may be adjusted to optimize the magnitude of the magnetic field. Because the first current and the second current have the same polarity, when the polarity changes both the magnetic field generated by the first current and the spin torque produced by the second current change direction. Therefore the first and second currents favor in switching the magnetic element(s) to the same desired state. Furthermore, the bit line magnetic field direction relative to the easy axis direction of the MTJ free layer may be adjusted to provide an optimized field angle for improved writing performance. Thus, the critical switching current may be reduced. Moreover the reliability, memory density and operation speed of the memory array may be increased.

In addition, the orientation between the easy axis of the magnetic element, such as the magnetic element 10, and the magnetic field generated by the first current can may be varied. Thus, the angle between the easy axis 19 and the magnetic field may be optimized to find an optimum field angle, for example for best switching time and switching current results. The desired angle between the easy axis (or equilibrium magnetization) and the magnetic field generated to assist in switching the magnetic element can be found as described below using the method 100 and the magnetic element 10.

The ensuing discussion is made based upon current understanding of spin transfer. For clarity, the magnetic element 10 influenced by a total effective field $H_{eff}$ that includes the magnetic field $H_B$ used to assist in switching will be described. The current induced magnetization switching process via spin transfer is described by Landau-Lifshiz-Gilbert equation with Slonzewski's spin transfer torque term:

$$\frac{d\hat{m}}{dt} = -\gamma \hat{m} \times H_{eff} - \alpha \gamma \hat{m} \times \hat{m} \times H_{eff} + \frac{\gamma \eta \hbar J}{\mu_0 M_s e d} \hat{m} \times [\hat{m} \times \hat{m}_P] \quad (1)$$

Where m is the unit vector of the data storage (e.g. free) layer magnetization, $m_p$ is the unit vector of the reference (pinned) layer magnetization, $M_s$ is the saturation magnetization of the free layer 18, $H_{eff}$ is the total effective magnetic field vector, J is the aerial density of the current passing through the magnetic element 10, e is the electron charge, d is the free layer thickness, γ is the gyromagnetic constant, α is the Gilbert damping constant, η is the spin transfer efficiency, $\mu_0$ is the vacuum permeability, and $\hbar$ is the reduced Planck's constant. In switching the magnetization of the free layer 18, electrons flowing from the reference layer or reflected from the reference layer 14 exert a spin transfer torque on the free layer 18 which tends to switch the magnetization of the free layer 18 if a proper current direction is chosen. In contrast, the damping torque, described by the second term on the right hand side of equation (1), tends to rotate the magnetization of the free layer 18 to the nearest energy minimum direction, which is usually the original direction. Before the free layer magnetization passes the energy barrier and rotates to the opposite direction, the damping torque is usually opposite to the spin transfer torque and works against switching. The energy barrier is the energy level separating one equilibrium energy state (e.g. free layer magnetization parallel to reference layer magnetization) from another energy state (e.g. free layer magnetization antiparallel to reference layer magnetization). When the current through the magnetic element 10 reaches the critical current $i_c$, the spin transfer torque will be large enough to overcome the damping torque and rotate the free layer magnetization. Stated differently, at a critical current, the magnetization of the free layer 18 can be switched. The critical current density $J_c$ is the areal density of the critical current $i_c$. Jc can be estimated from the equations:

$$J_c(\tau) = J_{c0}\left[1 - \frac{k_B T}{\Delta} \ln\left(\frac{\tau}{\tau_0}\right)\right], J_c < J_{c0}, \quad (2.a)$$

$$J_c(\tau) = J_{c0}\left[1 + \frac{\tau}{\tau_0} \ln\left(\frac{\pi}{2\theta_0}\right)\right], J_c > J_{c0}, \quad (2.b)$$

where $J_{c0}$ is the intrinsic critical current density, $k_B$ is Boltzman's constant, T is absolute temperature, Δ is the energy barrier of the free layer, τ is the current pulse width, $\tau_0$ is the inverse of attempting frequency and is usually set to be one nanosecond, and $\theta_0$ is the initial angle between the free layer magnetization and its equilibrium direction which is usually one easy axis 19 direction. Equation (2.a) is usually used when the current width is larger than approximately ten nanoseconds where the switching is dominated by thermal activation. In contrast, equation (2.b) is suitable for when the current width is less than approximately one nanosecond when the switching is dominated by dynamic spin precession. For magnetic memory applications the writing speed is usually a few nanoseconds, a time regime affected by both equations 2(a) and 2(b).

From the right hand side of equation (1) it can be seen that if the free layer magnetization and the reference layer magnetization are perfectly parallel or perfectly antiparallel, then the spin transfer torque is zero. If the free layer magnetization is also at the energy minimum position, the other two terms will also be zero. Therefore at these conditions the free layer 18 will not switch regardless of the current applied to the cell. When not at absolute zero temperatures, however, the thermal fluctuation can always activates the spin to a small random angle away from the energy minimum, or equilibrium position, to initiate the switching process.

Figure 6A:
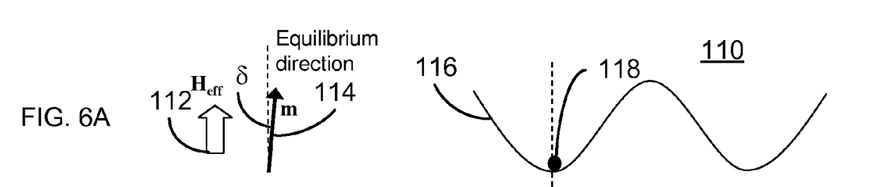
FIGS. 6A-6C depicting magnetizations, fields, and corresponding energy states during switching.

This situation is depicted in FIG. 6A, which is a representation 110 of a magnetic element such as the magnetic element 10 depicting magnetizations, fields, and corresponding energy states during switching. The representation 110 depicts the total effective magnetic field $H_{eff}$ 112, the direction of the free layer magnetization m 114 of the magnetic element 10, the free energy as a function of the angle between $H_{eff}$ and m 116 and the energy state 118 of the magnetic element 10 for the corresponding configuration 110. The small angle, δ, between $H_{eff}$ 112 and m 114 can initiate the switching process. Equation (2.b) indicates that the larger this initial angle δ is, the smaller the switching current or the shorter the switching time will be. When this initial angle is excited by a small random thermal fluctuation, the initial angle δ is very small and the magnetization state is very close to the equilibrium state (the energy minimum point and in the same direction with the effective field 112, the dashed line pointing at zero degrees). Thus the critical switching current and/or time are large and have large distributions due to the randomness of the thermal fluctuation.

Figure 6B:
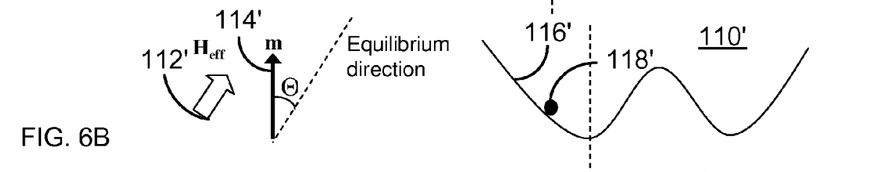

In contrast, FIG. 6B depicts a configuration 110' in which a magnetic field is pulsed, preferably starting at the same time when a current pulse applied to the magnetic element 112 is started. Thus, the configuration 110' may be provided using the method 100. Because the magnetic field is pulsed due to a first current being pulsed in a bit line, the total effective field $H_{eff}$ 112' is rotated by an angle Θ, therefore the equilibrium (the energy minimum point) is suddenly shifted away from the initial equilibrium position by an angle Θ (the dashed line pointing at Θ angle). Note that the total effective field might not be in the same direction with the applied field. This new, shifted configuration 110' is depicted in FIG. 6B. Thus, a large angle Θ between m 114' and $H_{eff}$ 112' is established. State differently, the energy state 118' is Θ away from the new equilibrium position. The rise time of the pulse used for the first current and thus the rise time for the magnetic field are preferably much smaller than the time needed for the spin to relax to the new equilibrium position (spin relaxation time). Thus, after the equilibrium position is shifted, the free layer magnetization, the electron spins, starts to process around the new equilibrium due to the large torque from the first term in the right hand side of the equation (1). Once the spin rotates away from the original equilibrium position a large spin transfer torque will be established. This large angle precession is thus initiated by a large and controllable angle, Θ, due to a magnetic field from the first current applied to the bit line instead of by a small random thermal fluctuation. Consequently, the switching time and critical current will be reduced, as discussed above. Furthermore, when this controllable, and thus repeatable, angle Θ is larger than the thermal fluctuation angle it dominates the switching process. Consequently, the distributions of the switching time and critical current caused by thermal fluctuation are also reduced.

Figure 6C:
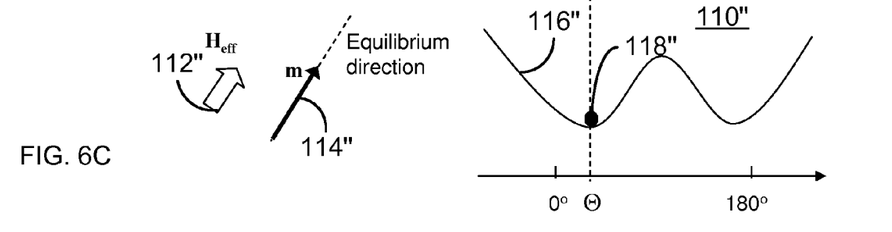

As discussed above, the first current and thus the magnetic field are preferably started at the same time when the second current pulse driven through the magnetic element 10 is started. If, instead, the magnetic field is static or is started a relatively long time (approximately a few nanoseconds) before the second current is applied to the magnetic element 10, the magnetization relaxes to the new equilibrium position before the spin transfer torque is turned on. This configuration is depicted in FIG. 6C, when a static field with the same strength and direction as the pulse field in FIG. 6B is applied. A comparison of the configurations 110' and 110", the energy distributions 116' and 116" are the same. However, the initial conditions of the two configurations 110' and 110" are different. In particular, the initial energy state 118' is at a higher energy than the initial energy state 118". In static field configuration 110", the free layer magnetization starts precessing from the energy minimum. While in pulse field configuration 110', the free layer magnetization starts precessing from a higher energy state. Thus, a larger energy barrier must be overcome to switch the magnetization state for the configuration 110", therefore either more current has to be applied through the magnetic element 10 or more time has to be taken to switch the magnetic element. Therefore, as described above, in a preferred embodiment, the first (magnetic field generating) current and second (spin transfer) current are turned on simultaneously in order to maximize the pulse field effect depicted in the configuration 110".

Moreover, from equation 2(b) it can be seen that a larger initial angle, Θ, results in a lower current required for switching. The initial angle can be increased by simply increasing the pulse field. However a too large field may be undesirable. For example, if the current through a bit line is too large, the magnetic field generated may decrease the thermal stability or even accidentally switch other bits on the same bit line.

For a given field strength there is an optimum field angle to achieve a maximum initial angle, Θ. For instance, for the case of a magnetic cell whose free layer has an in-plane uniaxial anisotropy K, an in-plane magnetic field with an angle Φ away from the initial equilibrium direction (before the field is applied), which is usually taken to be the easy axis direction of the free layer, is applied, and the free energy can be written as:

$$E = -K\cos^2\theta - HM_s\cos(\theta - \Phi) \quad (3)$$

where θ is the angle between the magnetization direction and the initial equilibrium direction. The new equilibrium angle θ is a function of Φ for fixed K, H, and Ms values, and can be found by:

$$\left(\frac{dE}{d\theta}\right)_{\theta=\Theta} = K\sin(2\Theta) + HM_s\sin(\Theta - \Phi) = 0 \quad (4)$$

Consequently, the maximum value of $$\Theta = \frac{1}{2}\sin^{-1}\left(\frac{HM_s}{K}\right)$$

can be found for $$\Phi = 90° + \frac{1}{2}\sin^{-1}\left(\frac{HM_s}{K}\right).$$

For example if $2K/M_s$ is one hundred and twenty Oersted and H is thirty Oersted, Θ reaches maximum value of fifteen degrees when Φ is one hundred and five degrees.

Figure 7:
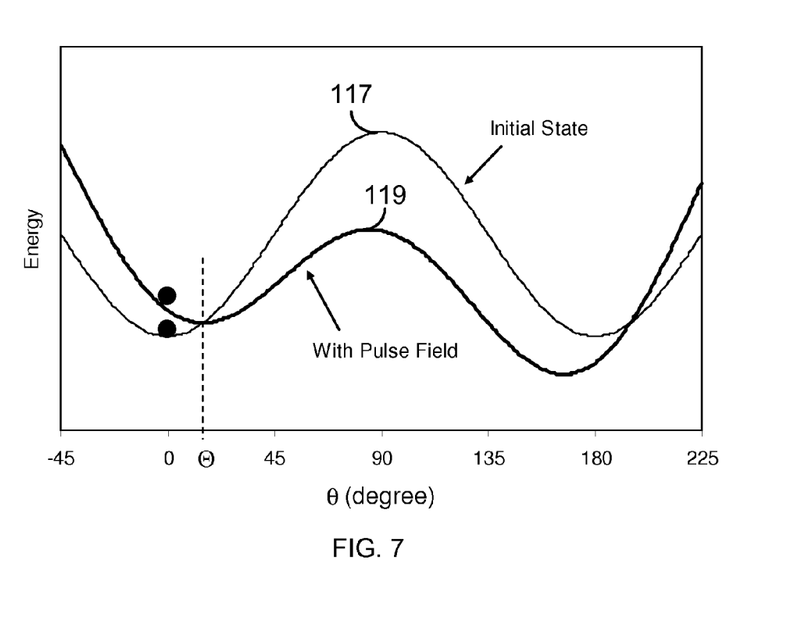
FIG. 7 depicts the free energy versus angle for a method in accordance with the present invention.

The free energy of the free layer magnetization as a function of θ is shown in FIG. 7. Curve 117 depicts the energy without a pulsed field, while curve 119 depicts the energy when using a pulsed field in accordance with the method 100 is used. The pulsed field for the curve is for the example above, with a $2K/M_s$ of one hundred and twenty Oersted and an H of thirty Oersted at one hundred and five degrees. Because the magnetization is initially at zero degrees, immediately after the pulse field is applied a fifteen degree magnetization initial angle with respect to the new equilibrium position is established. In addition, the energy barrier between the two energy minima at about ninety degrees is also decreased. According to equation 2(a) this reduction in the energy barrier further aids the switching of the free layer magnetization, in addition to the initial angle effect as discussed above. In memory device, however, a too small energy barrier height may result in accidental switching of the bits on the same bit line. By considering both switching performance and thermal stability of the magnetic elements, the optimized bit line field strength and angle can be determined. This bit line field strength and angle may deviate from the above calculation and can be adjusted according to the different requirements for memory devices for different applications. However this analysis should still be applicable. The field angle relative to the easy axis direction can be adjusted as will be described later.

Figure 14A:
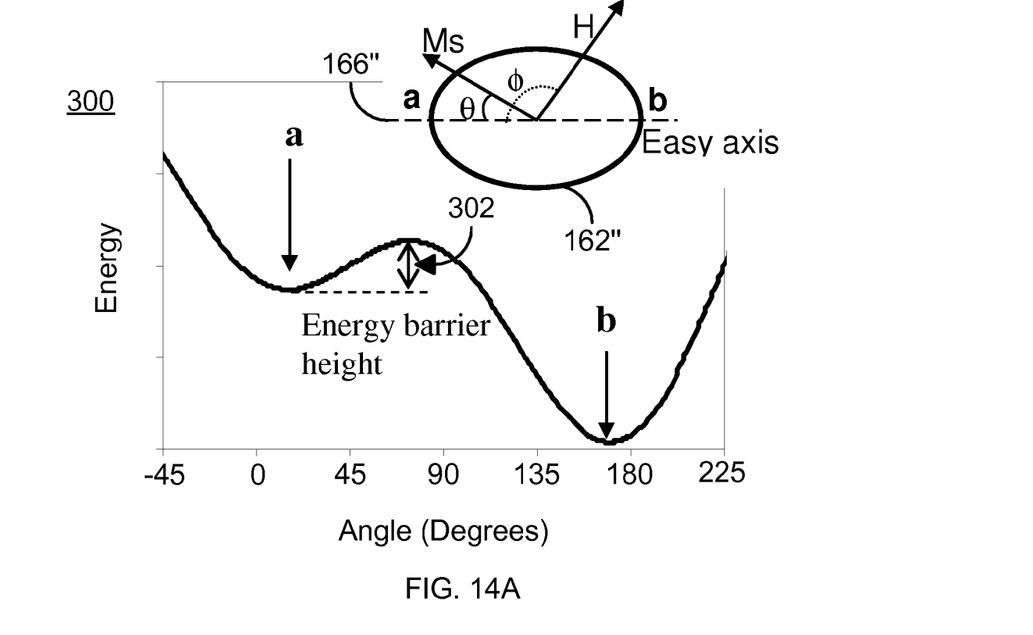
FIGS. 14A-14B depict the angles of field and magnetization, the dependence of energy states on magnetization angle and the dependence of energy barrier height on field angle.
Figure 14B:
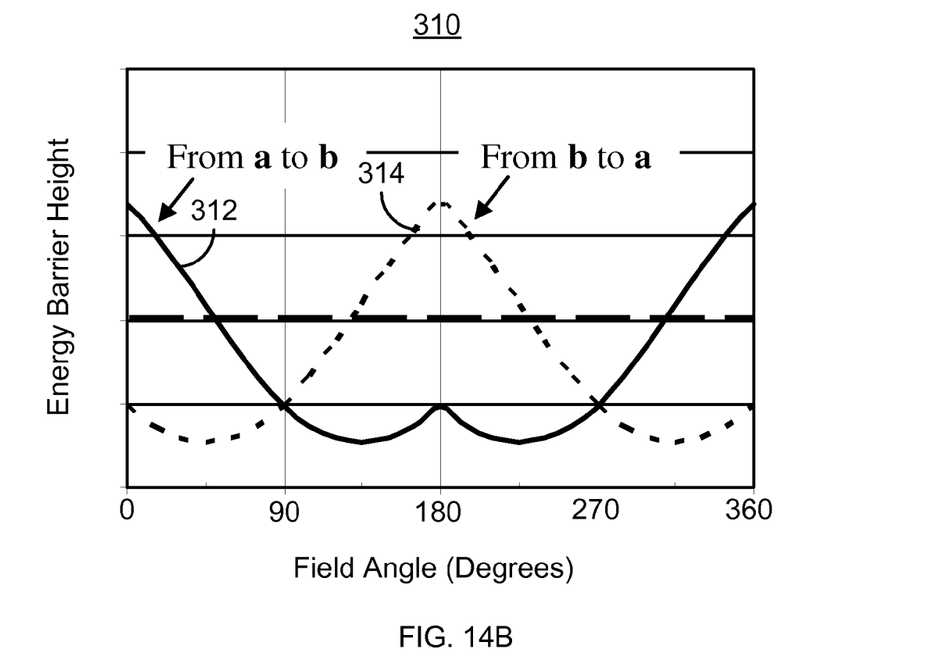

The effect of varying the angle of the magnetic field on switching energy barrier height may be understood as follows. FIGS. 14A and 14B depict examples of the switching energy barrier height calculated for the case in which 2K/Ms=200 Oe, Ms=1000 emu/cc and H=60 Oe for the magnetic element 162" having easy axis 166" shown in FIG. 14A. FIG. 14A also includes a graph 300 depicting the energy profile versus magnetization angle when the field is applied at a field angle, φ, of one hundred and thirty five degrees from the easy axis 166. Zero degrees is defined as along easy axis 166" of the free layer. Points a and b are the equilibrium positions. Point a is the equilibrium position close to zero degrees, while point b is the equilibrium position close to one hundred and eighty degrees. In order to switch the magnetization from point a to point b, an energy barrier 302 must be overcome. As the field angle, φ, changes, the height of the energy barrier 302 changes. Thus, the switching time, switching current and thermal stability may be changed based upon the field angle.

FIG. 14B is a graph 310 depicting the dependence of energy barrier 302 on the angle of φ of an applied field, for switching from state a to state b 312, and the case for switching from state b to state a 314. The horizontal broken line is the case with zero applied field. It can be seen from the graph 310 that when a magnetic field is applied, the energy barrier 302 may be reduced in height. The magnitude of the reduction depends on the field angle φ. When switching from point a to b, the energy barrier is minimum when the field is at ±135°. When switching from point b to a, the energy barrier is minimum when the field is at ±45°. More generally, in both cases the optimal field is 135° away from the easy direction close to the original equilibrium position, or 45° to the easy direction close to the equilibrium position one wants to switch the free layer magnetization to. It is believed that these optimal angles do not depend on the values of the K, Ms and H. Therefore for the purpose of reducing energy barrier height, the bit line 164/164' preferably has an angle of 45° to the easy axis 166/166'/166" of the free layer of the magnetic element 162/162'/162". Thus, the bit line field is preferably either in a 45° or 135° direction depending on the state desired to be written. In other words, the bit line field is preferably 135° away from the easy axis 164/164'/164" direction close to the original equilibrium position, or 45° from the easy axis 164/164'/164" direction close to the equilibrium position to which the free layer magnetization is desired to be switched. The polarity of the bit line field may be changed by reversing the direction of the current in the bit line 164/164'.

Considering both energy barrier effect (described for example in connection with FIGS. 11A-11B, and 14A-14B) and the initial angle effect (described for example with respect to FIGS. 6A-7), it is believed that the optimal field angle for minimum switching current will be somewhere between 135° and the angle described in equation (4). The actual value of the angle optimal angle may depend on the write current amplitude and pulse width, as well as other factors. When write current is larger than $J_{c0}$ or when the pulse width is close to or less than about 1 ns (equation 2(b)) larger initial angle is more effective. Thus, the optimal angle may be closer to the angle described in equation (4). When the write current is close to or less than $J_{c0}$ or when the pulse width is larger than about 1 ns (equation 2(a)) the energy barrier effect is more important, the optimal angle may be closer to 135°.

Figure 8:
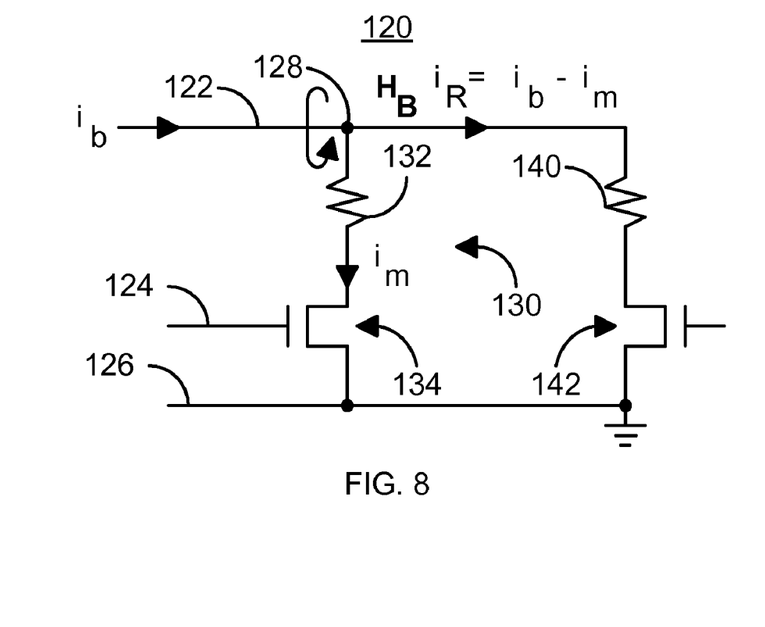
FIG. 8 depicts one embodiment of a magnetic memory in accordance with the present invention utilizing field-assisted switching.

FIG. 8 depicts one embodiment of a magnetic memory 120 in accordance with the present invention utilizing field-assisted switching. The magnetic memory 120 may be used in performing the method 100. The magnetic memory 120 includes a bit line 122, a word line 124, and a source line 126. Although shown as parallel, the bit line 122, word line 124, and source line 126 may have other orientations. The magnetic memory 120 also includes a magnetic storage cell 130, an optional resistor 140, and an isolation device 142. Note that although only one magnetic storage cell 130 is shown, typically, multiple magnetic storage cells are coupled to the bit line 122, word line 124, and source line 126. The magnetic storage cell 130 includes a magnetic element 132 and a selection device 134. The magnetic element 132 is programmable by driving a current through the magnetic element. For example, the magnetic element 132 might be a magnetic tunneling junction, a spin valve, another component similar to the magnetic element 10 depicted in FIG. 1, or other magnetic element programmable in a like manner. The selection device 134 is preferably a selection transistor having a gate connected to the word line 124, a drain connected to the magnetic element 132, and a source connected to the source line 126. The isolation device 142 is preferably an isolation transistor.

During a program operation, the selection device 134 and isolation device 142 are activated, allowing current to flow through the magnetic element 132 and the resistor 140. The node 128 thus operates as a current divider to split current between the magnetic element 132 and the resistor 140. Thus, a bit line current $i_B$ is driven through the bit line 122. At the node 128, the bit line current splits so that one portion, $i_m$, is driven through the magnetic element 132 while another portion, $i_R = V_{DD}/(Rr+Rt)$, may travel through the resistor 140 when the isolation device 142 is activated. Here $V_{DD}$ is the voltage between the bit line and the source line, Rr is the resistance of the resistor 140 and Rt is the resistance of the isolation device 142 when activated. Other resistances, such as the resistance of the bit line itself for instance, are neglected for clarity. Thus, the current 1R corresponds to the first current described above in the method 100 and the current $i_m$ corresponds to the second current described above in the method 100. This second current $i_m$ exerts a spin torque on the magnetic element 132 and results in a current induced switching. The first current, $i_R$, passes through the resistor 140 and to the source line 126, and induces a magnetic field $H_B$ to assist the current induced switching. The first current can be much larger than the second current if proper resistance values of Rr and Rt are selected. In particular, the total resistance of Rr and Rt may be much lower than that of the magnetic element 132. Therefore a large $H_B$, which is proportional to the current $i_R$, can be generated by the bit line current. Furthermore, in some embodiments, the resistor 140 may be omitted if Rt is selected to have a desired value.

In addition, in the memory 120, the magnetic field, $H_B$, is turned on at the same time with the first current, $i_m$, passing through the magnetic element 132. As a result, the first current and the magnetic field, $H_B$, are automatically synchronized. This magnetic field reduces the critical current required to program the magnetic element 132. Because a large magnetic field may be generated, only a lower second current may be necessary to switch the magnetic element 132. In addition, the magnetic field increases the switching speed. As a result, the memory can be operated with higher speed, smaller current, and, therefore, better reliability. The reduced, first current, $i_m$, allows for a reduced size of the selection transistor 134. Therefore, the density of the memory 120 may be increased.

During a read operation for the magnetic storage cell 130, the isolation device 142 is deactivated, while the selection device 134 is activated. Consequently, none of a read current driven through the bit line 122 passes through the resistor 140 and the isolation device 142. Instead, the read current passes through the magnetic storage cell 130. Use of the resistor 140 and the isolation device 142 thus may not adversely affect the performance of the magnetic memory 120 during reading.

Figure 9:
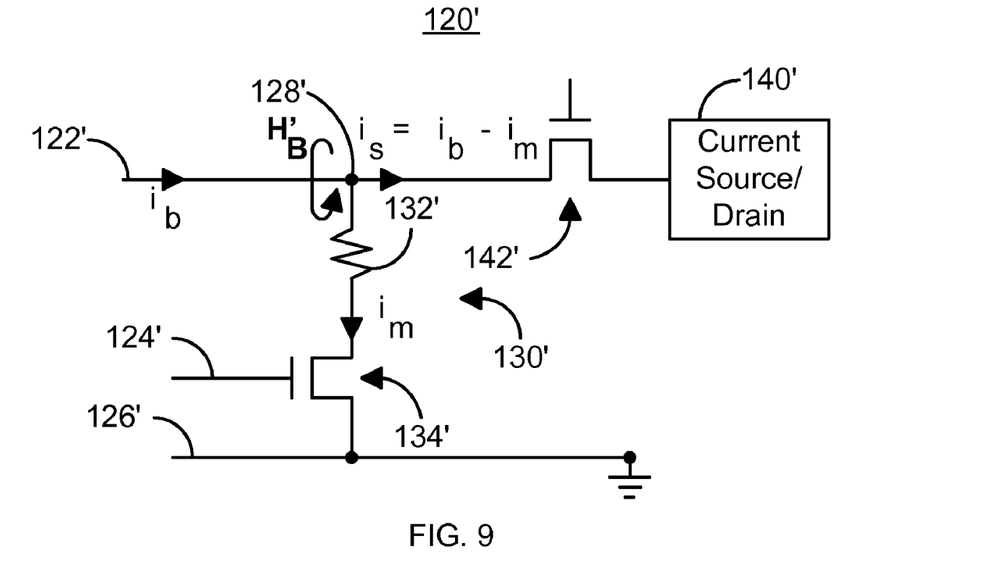
FIG. 9 depicts another embodiment of a magnetic memory in accordance with the present invention utilizing field-assisted switching.

FIG. 9 depicts another embodiment of a magnetic memory 120' in accordance with the present invention utilizing field-assisted switching. The magnetic memory 120' may be used in performing the method 100. The magnetic memory 120' is analogous to the magnetic memory 120 and thus has components labeled similarly. The magnetic memory 120' includes a bit line 122', a word line 124', and a source line 126'. Although shown as parallel, the bit line 122', word line 124', and source line 126' may have other orientations. The magnetic memory 120' also includes a magnetic storage cell 130', a current source/drain 140', and an isolation device 142'. Note that although only one magnetic storage cell 130' is shown, typically, multiple magnetic storage cells are coupled to the bit line 122', word line 124', and source line 126'. The magnetic storage cell 130' includes a magnetic element 132' and a selection device 134'. The magnetic element 132' is programmable by driving a current through the magnetic element. For example, the magnetic element 132' might be a magnetic tunneling junction, a spin valve, another component similar to the magnetic element 10 depicted in FIG. 1, or other magnetic element programmable in a like manner. The selection device 134' is preferably a selection transistor having a gate connected to the word line 124', a drain connected to the magnetic element 132', and a source connected to the source line 126'. The isolation device 142' is preferably an isolation transistor with a finite resistance when activated.

During a program operation, the selection device 134' and isolation device 142' are activated, allowing current to flow through the magnetic element 132 and the current source/drain 140. At the node 128' current is split between the magnetic element 132' and the bit line 122'. Thus, a bit line current 1B is driven through the bit line 122'. The second current, $i_m$, is driven through the magnetic element 132'. This second current $i_m$ exerts a spin torque on the magnetic element 132' and results in a current induced switching. In addition, the current $i_S = i_B - i_m$, travels to the current source/drain 140' when the isolation device 142' is activated. In a preferred embodiment, the current source/drain 140' has the same polarity as the source line 126' in order to ensure that the $i_m$ and is turned on at the same time and in the same direction. In addition, more current can be applied into the bit line 122' and a stronger magnetic field, $H_B'$, can be produced. As a result, the switching current and switching time can be further reduced. Although the complexity of the circuitry for the memory 120' is increased, only a small number of the extra current source/drains 140' may be needed for the entire memory array. Consequently, the density of the memory may only be slightly decreased due to the current source/drains. Due to the reduced critical switching current, the operation speed, reliability and overall density of the memory can be reduced as discussed above.

During a read operation for the magnetic storage cell 130', the isolation device 142' is deactivated, while the selection device 134' is activated. Consequently, none of a read current driven through the bit line 122' passes through the isolation device 142'. Instead, the read current passes through the magnetic storage cell 130'. Use of the isolation device 142' and the source/drain 140' thus may not adversely affect the performance of the magnetic memory 120' during reading.

Only the case in which current flows from the bit line 122 to the source line 126 is discussed above. Other factors that affect the current strength, e.g. the bit line resistance and source line resistance, are neglected for clarity. An analogous discussion could be made for the current flowing in another direction, for example from the source line 126 to the bit line 122. One of ordinary skill in the art will readily recognized that the methods discussed above can be readily used in other cases and when other factors are included.

Figure 10A:
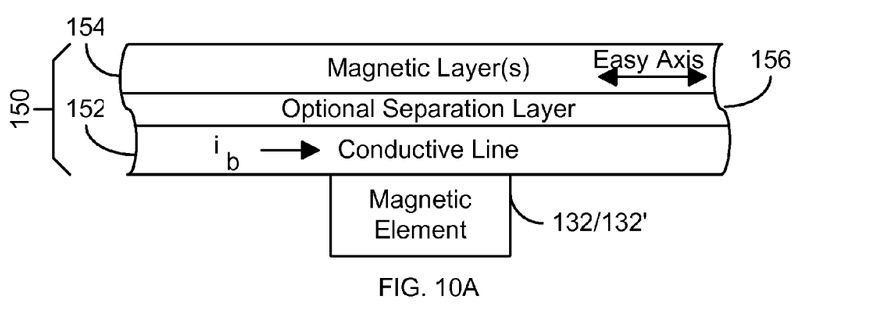
FIGS. 10A-10B are diagrams depicting one embodiment of a magnetic memory in accordance with the present invention utilizing a magnetic layer in the bit line during field assisted switching.
Figure 10B:
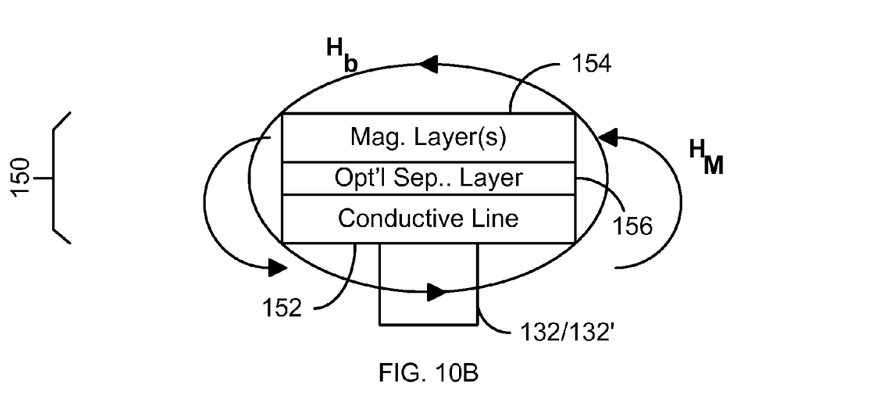

FIGS. 10A-10B are diagrams depicting of one embodiment in accordance with the present invention of a magnetic element 132/132' and bit line 150 during field assisted switching. FIG. 10A depicts a side view, while FIG. 10B depicts a front, cross-sectional view. The bit line 150 might be used in either the magnetic memory 120 or 120'. The bit line 150 includes a conductive line 152 that is preferably a metal line, soft magnetic layer(s) 154, and optional separation layer 156, which may be insulating or conductive. The line 152 is conductive and preferably nonmagnetic. Although depicted as residing only on the top of the bit line 150, the soft magnetic layer(s) 154 may reside on other surfaces, as well as on more than one surface, of the bit line 150. The separation layer 156 may be optionally placed between the line 152 and the soft magnetic layer(s) 154 to prevent or reduce the current in the soft magnetic layer(s). The soft magnetic layer(s) 154 can be single layer or multilayers including both magnetic layers and non-magnetic layers, and should preferably have larger resistivity than that of line 152 to reduce eddy current effect.

Use of the soft magnetic layer(s) 154 may further enhance the strength of the magnetic field to assist in switching the magnetic element. In particular, as shown in FIG. 10B, the soft magnetic layer(s) 154 have the easy axes parallel to the bit line 150 direction. When a current is driven through the line 152, the soft magnetic layer(s) are magnetized by the magnetic field $H_b$ generated by the current. Thus, a magnetostatic field, $H_M$, is induced by the soft magnetic layer(s). The magnetic element 132/132' experiences both magnetic fields, $H_B = H_b + H_M$, that are perpendicular to the bit line direction. Therefore, the magnetostatic field $H_M$ from the soft magnetic layer(s) 154 may enhance the magnetic field on the magnetic elements 132/132'. Because a fast rise time of the magnetic field at the magnetic element 132/132' is desired to assist the magnetic element switching, the damping constant of the soft magnetic layer(s) 154 is preferably higher than that of the data storage layer (e.g. the free layer 19) of the magnetic element 132/132'. Thus, the bit line current necessary to produce the required magnetic field to assist the current induced magnetization switching may be reduced. Consequently, power consumption of the memory 120/120' may be reduced.

Figure 11A:
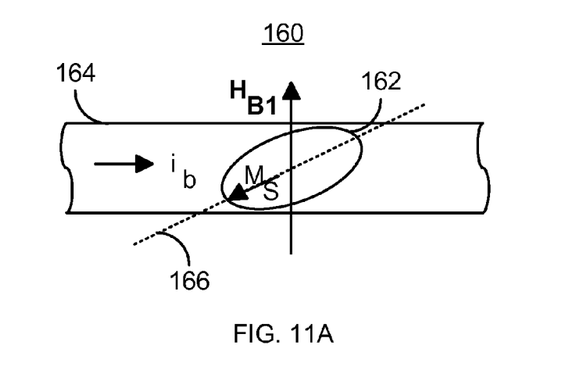
FIGS. 11A-11B depict embodiments of magnetic memories in accordance with the present invention utilizing a magnetic layer and bit line during field assisted switching.
Figure 11B:
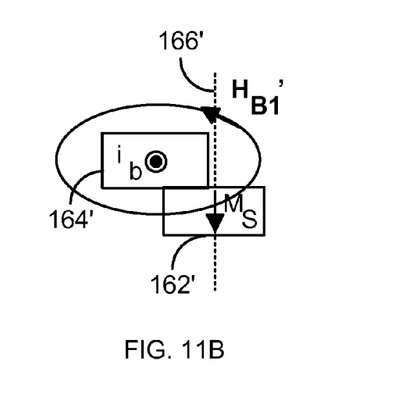

FIGS. 11A and 11B are diagrams depicting embodiments of memories 160 and 160' in accordance with the present invention of a magnetic element and bit line during field assisted switching. Magnetic elements 162/162' and bit lines 164/164' are shown. The magnetic elements 162 and 162' are analogous to the magnetic elements 132/132'. The bit lines 164 and 164' are analogous to the bit lines 122/122'. FIG. 11A depicts a top view of a case in which the magnetic element 162 has an in-plane anisotropy and, therefore, easy axis 166. For example, in some embodiments, the magnetic element 162 may have an in-plane anisotropy that includes one or more of a shape anisotropy, a crystalline anisotropy, an interface anisotropy, and an induced anisotropy. Alternatively, FIG. 11B depicts a cross-sectional view of a case in which the magnetic element 162' has an out-of-plane anisotropy and, therefore, out of plane easy axis 166'. For example, in some embodiments, the magnetic element 162 may have a perpendicular anisotropy that includes one or more of a shape anisotropy, a crystalline anisotropy, an interface anisotropy, and an induced anisotropy. As can be seen in FIGS. 11A and 11B, the direction of the magnetic field, $H_{B1}$ and $H_{B1}'$ may be varied with respect to the easy axis directions 166 and 166'. The magnetic field direction relative to the easy axis direction of the data storage layer of the magnetic element 162 may be adjusted by rotating the in-plane angle of the magnetic element 162 if the free layer easy axis 166 is in plane. This situation is depicted in FIG. 11A. Similarly, the magnetic field direction relative to the easy axis direction of the data storage layer of the magnetic element 162' may be adjusted by shifting the in-plane bit line 164' position and the magnetic element 162' position if the data storage layer easy axis 166' is out of film plane. This case is shown in FIG. 11B. In this case, a metal line connecting the bit line 164' and the magnetic element 162' may be added if the bit line 164' and the magnetic element 162' are not in direct electrical contact due to the shift. Thus, as discussed above with respect to FIGS. 6A-C and 7, the angle between the easy axis 166/166' (and thus the initial magnetization direction) and the magnetic field may be optimized to find an optimum field angle for best switching time, switching current and thermal stability results.

Thus, using the method 100 and/or the system 120, 120' 150 and/or 160, the second current driven through the magnetic element(s) 10/132/132'/162/162' may be reduced while allowing the magnetic element(s) 10/132/132'/162/162' to be switched. In addition, because the first current generating the magnetic field is not driven through the magnetic element(s) 132/132', the first current may be large. As a result, the magnetic field strength may be increased without increasing the current through the magnetic element(s) 132/132'. The magnetic field can assist the switching of the magnetic element(s) 132/132' with a low current driven through the element(s). Consequently, reliability of the magnetic element may be improved. For similar reasons, the size of the selection transistor 134/134' and, therefore, the magnetic storage cell 130/130' may be reduced. Because the direction of the magnetic field generated by the current driven through the bit line depends on the current direction, the direction of the magnetic field automatically changes to assist in switching the magnetic element(s) to the desired state when the first current and the second current change direction. Furthermore, the bit line magnetic field direction relative to the easy axis direction of the MTJ free layer may be adjusted to provide an optimized field angle for improved writing performance. In addition, use of a pulsed field may improve the distribution of the switching of the magnetic element(s) 132/132'. Thus, switching current and its distribution may be reduced. Reliability, memory density and operation speed of the memory array may also be increased.

Figure 12:
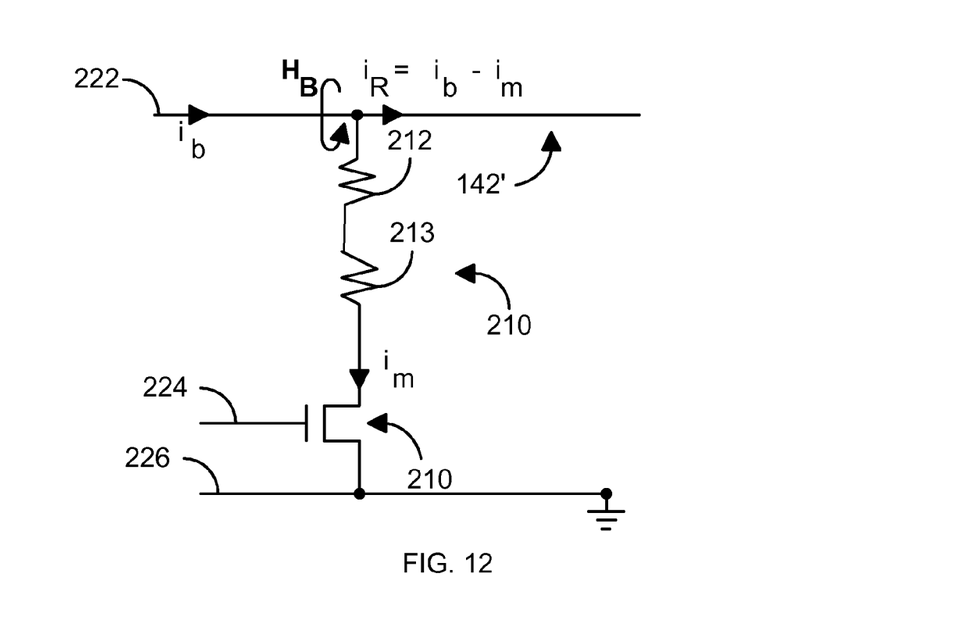
FIG. 12 depicts another embodiment of a magnetic memory in accordance with the present invention utilizing two magnetic elements and bit line during field assisted switching.

The method 100 provides a method to reduce the switching current driven through the magnetic element. The method also provides another way to select the write operation device in addition to the conventional methods such as choosing word line and bit line. With this selection method the magnetic elements of a memory can be stacked in three dimensions. FIG. 12 depicts one embodiment of a magnetic memory 200 in accordance with the present invention utilizing two magnetic elements 212 and 213 that are preferably MTJs stacked on top of each other and selection transistor 214 in a magnetic storage cell 210. Also depicted are bit line 222, word line 224, and source line 226. Because magnetic elements 212 and 213 are connected in series, they share the same current $i_m$. The total resistance of the magnetic storage cell 210 has four states: R1+R2, R1+Δ1+R2, R1+R2+Δ2, R1+Δ1+R2+Δ2, where R1 and R2 are resistances of magnetic elements 212 and 213, respectively, at one state, □1 and □2 are the resistance changes for the magnetic elements 212 and 213, respectively, when they are switched to the other state. If Δ1 and Δ2 are designed to have different values, the four states will have four different resistance values. Therefore the two magnetic elements 212 and 213 can store two bits of binary data. For the simplicity of discussion, here we can define the above four states as (0,0), (1,0), (0,1) and (1,1) states, respectively, and we assume that a large enough positive current $i_m$ can write a magnetic element 212 or 213 to "1" state and a large enough negative current $i_m$ can write a magnetic element 212 or 213 to "0" state. The definition of the states and the direction of writing current can be changed but will essentially have the same results. During read operation the data can be read out by reading the total resistance of the two magnetic elements. Note that the magnetic element 212 is closer to the bit line 222 than the magnetic element 213. Consequently, the magnetic element 212 experiences a much larger magnetic field produced by the first current 1R in the bit line 222. The method 100 may also be used with the memory 200. Stated differently, the memory 200 functions in a similar manner to the system 120, 120' 150 and/or 160 discussed above. The magnetic element 212 can be switched at a smaller current than the magnetic element 213, because the magnetic element 212 has more help from the bit line magnetic field. Stated differently, the critical switching current of the magnetic element 212 is smaller than that of the magnetic element 213. Based on this feature, the writing operation can be carried out as follows: To write (1,1), the current $i_m$ is positive and larger than the critical switching current of the magnetic element 213 to switch both the magnetic element 212 and the magnetic element 213 to "1" states; to write (0,0), the current $i_m$ is larger than the critical switching current of the magnetic element 213 but in negative direction; to write (1,0), a current larger than the critical switching current of the magnetic element 213 in a negative direction has to be applied to write (0,0), then a current between the critical switching current of the magnetic element 212 and the magnetic element 213 in positive direction is applied to only switch the magnetic element 212 to "1" state, a (1,0) state is then written by this two step operation; to write (0,1) state, similarly, a current larger than the critical switching current of the magnetic element 213 in positive direction and the a current between the critical switching currents of the magnetic element 212 and the magnetic element 213 in a negative direction have to be sequentially applied. Therefore during write operation the two bits of the memory cell have to be both written, through a one-step or a two-step write sequence. An advantage of stacking two bits in one magnetic cell is that the density of the memory array increases.

Figure 13:
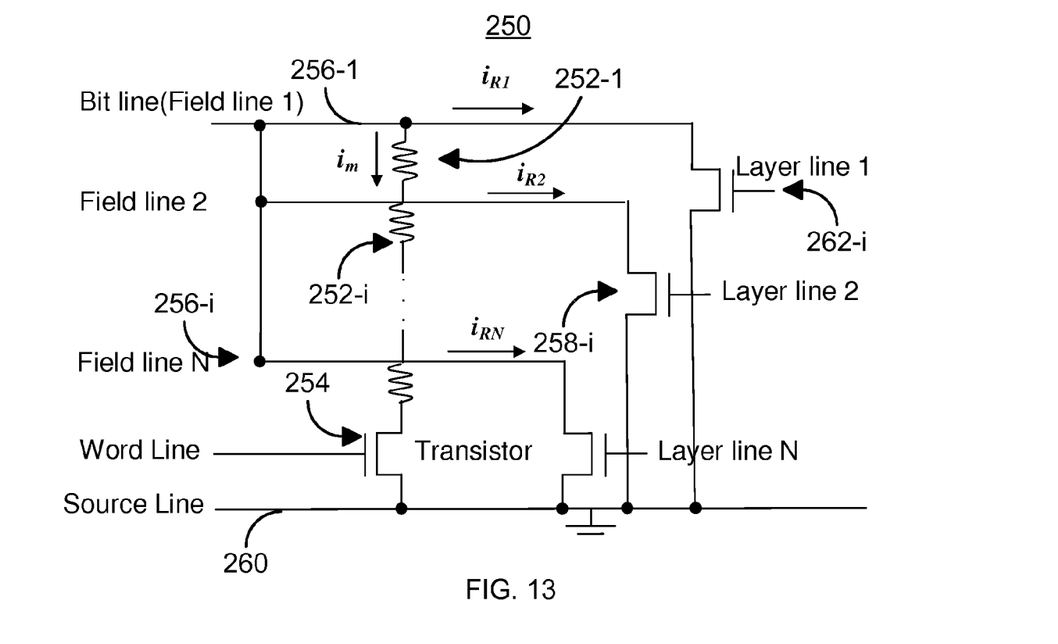
FIG. 13 depicts another embodiment of a magnetic memory in accordance with the present invention utilizing two or more magnetic elements and field lines during field assisted switching.

Another method of stacking multiple bits in one cell can further increase the number of layers of magnetic elements to more than two. FIG. 13 depicts one embodiment of on such memory 250 in accordance with the present invention. The memory 250 includes magnetic elements 252-i, selection transistor 254, field lines 256-i, layer selection/isolation device 258-i, source line 260, and layer lines 262-i. In this embodiment 250 two or more layers of magnetic elements 252-1, 252-2 through 252-N, are stacked on top of each other and are connected in series. Except for the first layer (top layer), the magnetic element 252-i of each layer has an adjacent field line 256-i that is not connected to the magnetic element 252-i. The field line 256-1 of the first layer is connected to the first magnetic element 252-1 and functions as a bit line to apply the current $i_m$ through the magnetic elements. Each of the field lines 256-i are only close enough to the magnetic element 252-i in the same layer so that the magnetic field generated by the field line 256-i can only significantly assist the switching of the nearest magnetic element 252-i. The end of each field line 256-i is connected to the source line 260 through an isolator 256-i and an optional resistor (not shown), or to a source/drain device, with the same method described in embodiments 120 or 120'. In the magnetic memory 250 only isolation transistors 258-i are shown as example. Each magnetic element 252-i has two magnetic states, Ri and Ri+Δi (i=1 ... N). If all the Δi have different values, the total resistance will have $2^N$ states, and the whole cell can store N bits binary data. The writing operation can be done by applying a current $i_m$ through all the magnetic elements 252-i, while only active the isolation transistors 258-i corresponding to the target magnetic elements. For example if we want to write "1" to magnetic 252-1 and 252-3, a positive current $i_m$ is applied to all the magnetic elements 252-i in the cell through the bit line 256-1 by applying a positive voltage on the bit line 256-1 and activating the selection transistor 254. This current alone is not large enough to switch any magnetic elements 252-i. At the same time when $i_m$ is started, the isolation transistor 258-1 and 258-3 are activated by the layer line 262-1 and 262-3, thus field line 256-1 and 256-3 generate magnetic fields on magnetic elements 252-1 and 252-3. With the assistance of the magnetic field, $i_m$ is able to switch magnetic elements 252-1 and 252-3 to "1" states. Similarly by applying a negative current $i_m$ and activating isolation transistor 254-1 and 254-3, states "0" can be written to magnetic elements 252-1 and 252-3. With this method, the magnetic elements in the cell can be programmed either individually or in groups. By writing data in groups, two write operations can write all the possible combinations of data to the N bit cell.

A method and system for providing and using a magnetic memory utilizing field assisted spin transfer based switching has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

I claim:

1. A method for programming a magnetic memory, the magnetic memory including a plurality of magnetic storage cells and a plurality of bit lines, each of the plurality of magnetic storage cells including at least one magnetic element programmable due to spin transfer when a write current is passed through the magnetic element and at least one selection device, at least one bit line of the plurality of bit lines coupled to the at least one magnetic element of the plurality of magnetic elements, wherein at least one magnetic layer of the at least one magnetic element has in-plane anisotropy, the method comprising:

driving a first current in proximity to but not through the at least one magnetic element of a portion of the plurality of magnetic storage cells, the first current being driven through a portion of the plurality of bit lines and generating a magnetic field;

driving a second current through the at least one magnetic element of the portion of the plurality of magnetic storage cells, the second current and the first current being turned on at a start time, the second current and the magnetic field being sufficient to program the at least one magnetic element;

wherein the at least one magnetic element makes an angle with the plurality of the bit lines in a film plane, the angle being based on the in-plane an isotropy.

2. The method of claim 1 wherein the in-plane anisotropy is a uniaxial anisotropy along an axis and having a strength K, wherein a data storage layer of the at least one magnetic element has a saturation magnetization of Ms, wherein the magnetic field has a strength H, and wherein a field angle between the magnetic field and the axis is between the field angle based upon the angle of 135° and substantially ninety degrees plus one-half multiplied by the inverse sin of H multiplied by Ms divided by K.

3. The method of claim 1 wherein the first current corresponds to a first current pulse.

4. The method of claim 3 wherein the first current pulse has a rise time and the magnetic element has a magnetic relaxation time that is greater than the first current pulse rise time.

5. A magnetic memory comprising:

a plurality of magnetic storage cells, each of the plurality of magnetic storage cells including at least one magnetic element programmable due to spin transfer when a write current is passed through the magnetic element and at least one selection device, the at least one magnetic element having an in-plane an isotropy;

a plurality of bit lines coupled to the at least one magnetic element of the plurality of magnetic storage cells, the plurality of bit lines for driving a first current and a second current, the first current being driven in proximity to but not through the at least one magnetic element of a portion of the plurality of magnetic storage cells, the first current generating a magnetic field, the second current being driven through the at least one magnetic element of the portion of the plurality of magnetic storage cells, the second current and the magnetic field being sufficient to program the at least one magnetic element;

wherein the at least one magnetic element makes an angle with the plurality of the bit lines in a film plane, the angle being based on the in-plane an isotropy.

6. The magnetic memory of claim 5 wherein the in-plane anisotropy is a uniaxial anisotropy along an axis and having a strength K wherein a data storage layer of the at least one magnetic element has a saturation magnetization of Ms, wherein the magnetic field has a strength H, and wherein a field angle between the magnetic field and the axis is between the field angle based upon the angle of 135° and substantially ninety degrees plus one-half multiplied by the inverse sin of H multiplied by Ms divided by K.

7. The magnetic memory of claim 5 further comprising:

at least one isolation device connected to the plurality of bit lines, the first current passing through the at least one isolation device.

8. The magnetic memory of claim 5 further comprising:

at least one resistor connected to the plurality of bit lines and the at least one isolation device, the first current passing through the at least one resistor.

9. The magnetic memory of claim 5 further comprising:

at least one of a current source or a drain connected to the end of the at least one of the plurality of bit lines such that the first current does not pass through the at least one magnetic element.

10. The magnetic memory of claim 5 wherein the plurality of bit lines further includes at least one nonmagnetic conductive layer, the magnetic memory further comprising:

at least one magnetic layer adjacent to the at least one nonmagnetic conductive layer.

11. The magnetic memory of claim 10 wherein the at least one magnetic element includes a reference layer, a free layer, and a spacer layer residing between the reference layer and the free layer, the at least one magnetic layer having a first magnetic damping constant, the free layer having a second magnetic damping constant less than the first magnetic damping constant.

12. The magnetic memory of claim 5 wherein the in-plane anisotropy includes at least one of a shape anisotropy, a crystalline anisotropy, and an induced an isotropy.

13. The magnetic memory of claim 5 wherein the at least one magnetic layer of the magnetic element has an out of plane anisotropy.

14. The magnetic memory of claim 13 wherein the out of plane anisotropy includes at least one of a shape anisotropy, a crystalline anisotropy, an interface anisotropy, and an induced anisotropy.

15. The magnetic memory of claim 14 wherein the at least one magnetic element has a center and each of at least of a portion of the plurality of bit lines has a bit line center, the center of at least one magnetic element being offset from the bit line center by an angle, the angle being based on the perpendicular an isotropy.

16. The magnetic memory of claim 5 wherein the at least one magnetic storage cell further includes at least two magnetic element programmable due to spin transfer when a write current is passed through the magnetic elements and at least one selection device, the at least two magnetic elements having at least one of the in-plane anisotropy and an out-of-plane anisotropy.

17. The magnetic memory of claim 16 further comprising:
at least one of an isolation device and at least one optional resistive device connected to each of the plurality of bit lines, the first current passing through the bit line, the activated isolation device, and the optional resistive device.

18. The magnetic memory of claim 16 further comprising:
at least one of a current source and a drain connected to the at least one of the plurality of bit lines.

19. The magnetic memory of claim 16 wherein at least one of the plurality of bit lines further includes:
a nonmagnetic metal layer and at least one magnetic layer adjacent to the non-magnetic metal layer.

20. The magnetic memory of claim 5 further comprising:
a plurality of field lines, each of the plurality of field lines coupled to one of the at least two magnetic elements, the plurality of field lines for driving the first current, only a first field line of the plurality of field lines for driving the first and the second current, the second current being driven through all the magnetic elements of the portion of the plurality of magnetic storage cells, the second current generating a sufficient spin torque to program the at least one magnetic element coupled with the field line and insufficient spin torque to program another of the at least one magnetic element not coupled with the field line.

* * * * *